United States Patent
Xu

(10) Patent No.: US 7,939,353 B1
(45) Date of Patent: May 10, 2011

(54) METHODS OF FORMING INTEGRATED CIRCUITS

(75) Inventor: Jeff J. Xu, Jhubei (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 12/892,254

(22) Filed: Sep. 28, 2010

(51) Int. Cl.
*H01L 21/00* (2006.01)

(52) U.S. Cl. .......................... 438/38; 438/240; 257/310

(58) Field of Classification Search ................... 438/38, 438/240; 257/310
See application file for complete search history.

(56) References Cited

U.S. PATENT DOCUMENTS

| 4,961,829 A * | 10/1990 | Mainzer et al. ............... 205/159 |
| 6,838,300 B2 * | 1/2005 | Jin et al. ........................ 438/38 |
| 7,659,475 B2 * | 2/2010 | Agostinelli et al. .......... 136/256 |

* cited by examiner

*Primary Examiner* — Jarrett J Stark
*Assistant Examiner* — Nicholas Tobergte
(74) *Attorney, Agent, or Firm* — Lowe Hauptman Ham & Berner, LLP

(57) ABSTRACT

A method of forming an integrated circuit includes forming a fluorine-passivated surface of a substrate. A device quality silicon oxide layer is formed by causing the fluorine-passivated surface to interact with an oxygen-containing gas. Hydroxyl groups are substantially formed on a surface of the device quality silicon oxide layer. A high dielectric constant (high-k) gate dielectric layer is formed on the surface of the device quality silicon oxide layer.

20 Claims, 11 Drawing Sheets

METHODS OF FORMING INTEGRATED CIRCUITS

CROSS-REFERENCES TO RELATED APPLICATIONS

The present application is related to U.S. application Ser. No. 12/687,574, entitled "METHODS AND APPARATUS OF FLUORINE PASSIVATION" filed on Jan. 14, 2010, and U.S. application Ser. No. 12/789,681, entitled "Scaling EOT by Eliminating Interfacial Layers from High-K/Metal Gates of MOS Devices" filed on May 28, 2010, which are incorporated herein by reference.

TECHNICAL FIELD

The present disclosure relates generally to the field of semiconductor devices, and more particularly, to methods of forming integrated circuits.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor (CMOS) devices.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the numbers and dimensions of the various features may be arbitrarily increased or reduced for clarity of discussion.

DETAILED DESCRIPTION

Figure 1:
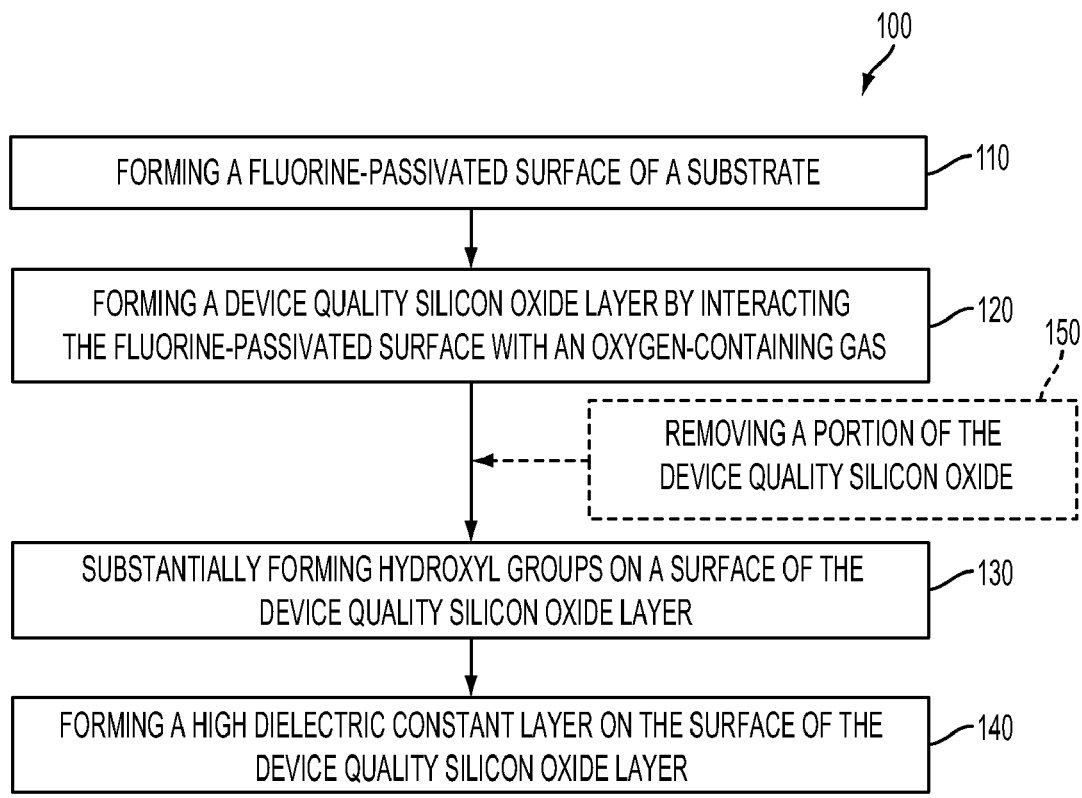
FIG. 1 is a flowchart of an exemplary method of forming an integrated circuit.

In the course of integrated circuit evolution, functional density (i.e., the number of interconnected devices per chip area) has generally increased while geometry size (i.e., the smallest component (or line) that can be created using a fabrication process) has decreased. For example, the reliability and functional challenges of ultrathin gate oxides are becoming increasingly greater for increasingly small IC devices. Hence, reduction in interface defect density (Dit) at the substrate/oxide interface to increase carrier mobility and reduce current leakage, and reduction in capacitive effective thickness (Cet) to increase scale, in current IC fabrication processes is highly desirable.

Standard cleaning 1 (SC1) process has been widely used to clean substrate surfaces before formation of a silicon oxide interfacial layer. It is found that a chemical oxide layer is prone to being formed on the substrate surfaces during the SC1 process. The chemical oxide layer can adversely affect an equivalent oxide thickness (EOT) of the interfacial layer and a high dielectric constant (high-k) dielectric material formed thereon. The chemical oxide layer may also adversely affect gate leakage current of transistors formed on the substrates.

It is understood that the following descriptions provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "below," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

Illustrated in FIG. 1 is a flowchart of an exemplary method of forming an integrated circuit. FIGS. 2A-2I are schematic cross-sectional views of an integrated circuit during various fabrication stages. The integrated circuit may include various passive and active microelectronic devices, such as resistors, capacitors, inductors, diodes, metal-oxide-semiconductor field effect transistors (MOSFETs), complementary MOS (CMOS) transistors, bipolar junction transistors (BJTs), laterally diffused MOS (LDMOS) transistors, high power MOS transistors, FinFET transistors, or other types of transistors. It is understood that FIGS. 2A-2I have been simplified for a better understanding of the concepts of the present disclosure. Accordingly, it should be noted that additional processes may be provided before, during, and after the method 100 of FIG. 1, and that some other processes may only be briefly described herein.

Referring now to FIG. 1, the method 100 can include forming a fluorine-passivated surface of a substrate (block 110). The method 100 can include forming a device quality silicon oxide layer by causing the surface of the substrate to interact with an oxygen-containing gas (block 120). The method 100 can include substantially forming hydroxyl groups on a surface of the device quality silicon oxide layer (block 130). The method 100 can include forming a high dielectric constant (high-k) gate dielectric layer on the surface of the device quality silicon oxide layer (block 140). In some embodiments, the method 100 can optionally include removing a portion of the device quality silicon oxide (block 150). The removing process can be arranged between forming the device quality silicon oxide layer and substantially forming the hydroxyl groups.

Figure 2A:
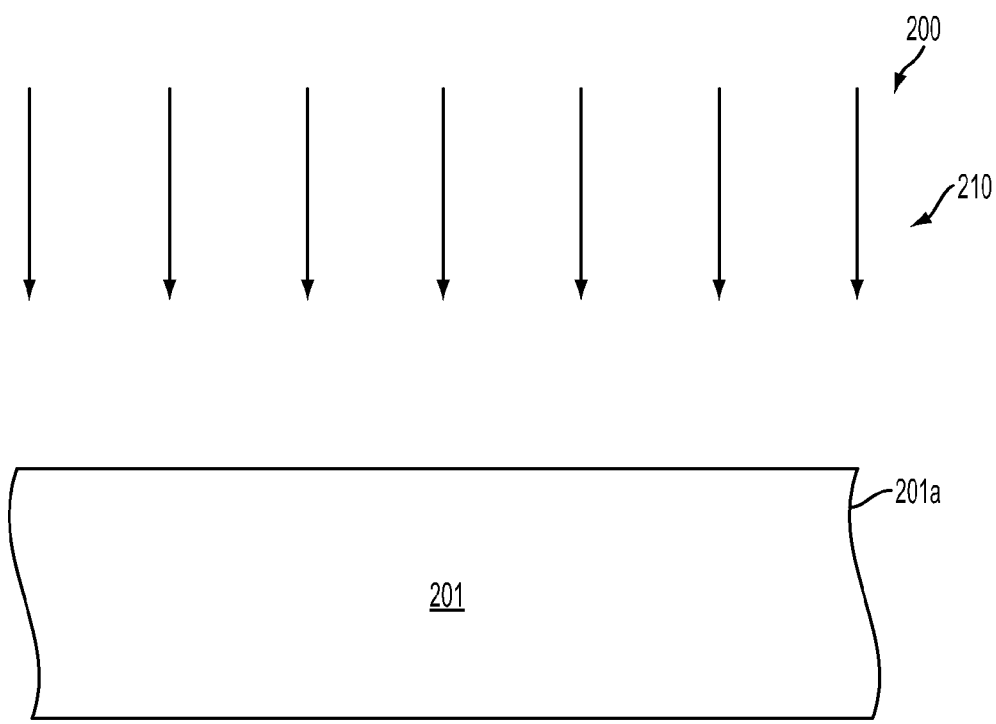
FIGS. 2A-2I are schematic cross-sectional views of an integrated circuit during various fabrication stages.

Referring now to FIGS. 2A-2I in conjunction with FIG. 1, an integrated circuit 200 can be fabricated in accordance with the method 100 of FIG. 1. In FIG. 2A, the integrated circuit 200 can have a substrate 201. The substrate 201 can be a silicon substrate doped with a P-type dopant, such as boron (a P-type substrate). Alternatively, the substrate 201 could be another suitable semiconductor material. For example, the substrate 201 may be a silicon substrate that is doped with an N-type dopant, such as phosphorous or arsenic (an N-type substrate). The substrate 201 may alternatively be made of some other suitable elementary semiconductor, such as diamond or germanium; a suitable compound semiconductor, such as silicon carbide, silicon germanium, indium arsenide, or indium phosphide; or a suitable alloy semiconductor, such as silicon germanium carbide, gallium arsenic phosphide, or gallium indium phosphide. Further, the substrate 201 could include an epitaxial layer (epi layer), may be strained for performance enhancement, and may include a silicon-on-insulator (SOI) structure.

In some embodiments, shallow trench isolation (STI) features (not shown) may also be formed in the substrate 201. The STI features can be formed by etching recesses (or trenches) in the substrate 201 and filling the recesses with a dielectric material. In some embodiments, the dielectric material of the STI features includes silicon oxide. In alternative embodiments, the dielectric material of the STI features may include silicon nitride, silicon oxynitride, fluoride-doped silicate (FSG), and/or any suitable low-k dielectric material.

Referring to 2A, a top surface 201a of substrate 201 can undergo a surface cleaning process 210 (as shown by downward arrows) to remove particulates and/or contaminants, which may include organic and/or metallic materials. The surface cleaning process 210 may include a variety of chemicals and techniques, and in one example may include the use of hydrofluoric acid, ammonium hydroxide, hydrogen peroxide, hydrochloric acid, sulfuric acid, and/or ozone. In some embodiments, the chemicals may be utilized in a wet dip or liquid, vapor and/or heated environment to clean the substrate surface. In other embodiments, standard RCA, SPM, standard cleaning 1 (SC1), and/or standard cleaning 2 (SC2) chemicals and processes may be used to clean the substrate surface.

Figure 2B:
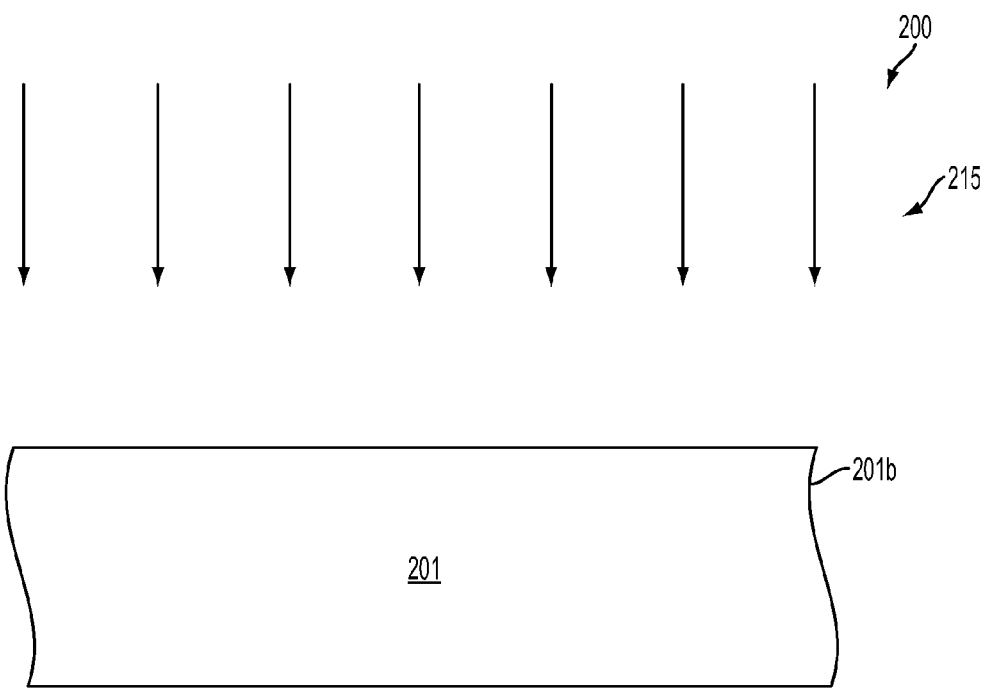

Referring to FIGS. 1 and 2B, the process shown in block 110 can include a fluorine passivation process. As shown in FIG. 2B, the cleaned surface 201a of the substrate 201 can undergo a fluorine passivation process 215 (as shown by downward arrows) to form a fluorine-passivated surface 201b on which silicon-hydrogen bonds and silicon-fluorine bonds are substantially formed.

In some embodiments, the fluorine passivation process 215 can use a vapor phase fluorine-containing chemical to form the fluorine-passivated surface 202. The fluorine passivation process 215 can be substantially free from water ($H_2O$). Without water, native oxide can be free from forming on the fluorine passivation process 215.

In some embodiments, a passivation mixture can include fluorine and an alcohol, such as isopropyl alcohol (IPA), methanol, or ammonia. For example, the passivation mixture may include a hydrous hydrofluoric acid vapor and an IPA vapor supplied by a carrier gas such as nitrogen. In some embodiments, the passivation mixture includes between about 10 wt % and about 80 wt % of hydrous hydrofluoric acid vapor, for example including hydrofluoric acid at about 49 wt %. In other embodiments, the passivation mixture includes hydrofluoric acid vapor and IPA vapor at a weight ratio of around 0.5/1 to 10/1, for example around 3/1. In still other embodiments, the passivation mixture may include hydrofluoric acid and an alcohol in a vapor phase form of HF and IPA. In yet still other embodiments, the passivation mixture may include hydrofluoric acid and ammonia ($NH_3$). Other carrier gases which are substantially non-reactive with silicon, such as argon, may be suitable.

As noted, the surface 201b substantially includes hydrogen and fluorine. The surface 201b may include minor amount of carbon, oxygen, and other elements as long as the amount of the elements would not adversely affect the device quality silicon oxide that is formed on the surface 201b. In some embodiments, the fluorine passivation process 215 can form the surface 201b to include fluorine at an atomic concentration greater than 2% and/or to minimize the atomic concentration of carbon and oxygen residue at the fluorine-passivated surface 201. The amount of hydrofluoric acid and alcohol provided in the passivation mixture may be used to tune the fluorine passivation process 215.

In some embodiments, the fluorine passivation process 215 may occur at between ambient temperature and about 100 degrees Celsius and between atmospheric pressure and about 300 torr, and does not include high temperature implantation, annealing, UV light, or plasma processing, thereby avoiding interface defects that may occur from those processes. In other embodiments, the fluorine passivation process 215 may occur at between room temperature and about 100 degrees Celsius and between 1 mtorr and about 10 torr, and then with a baking process from about 50 to about 200 degrees.

In some embodiments, the fluorine-passivation process 215 can lower interface defect density (Dit), which allows for enhanced insulation and function of the gate oxide to increase carrier mobility, and increase device reliability. In other embodiments, the fluorine-passivation process 215 can reduce current effective thickness (Cet) of the gate oxide layers to improve scale in IC device fabrication.

Figure 2C:
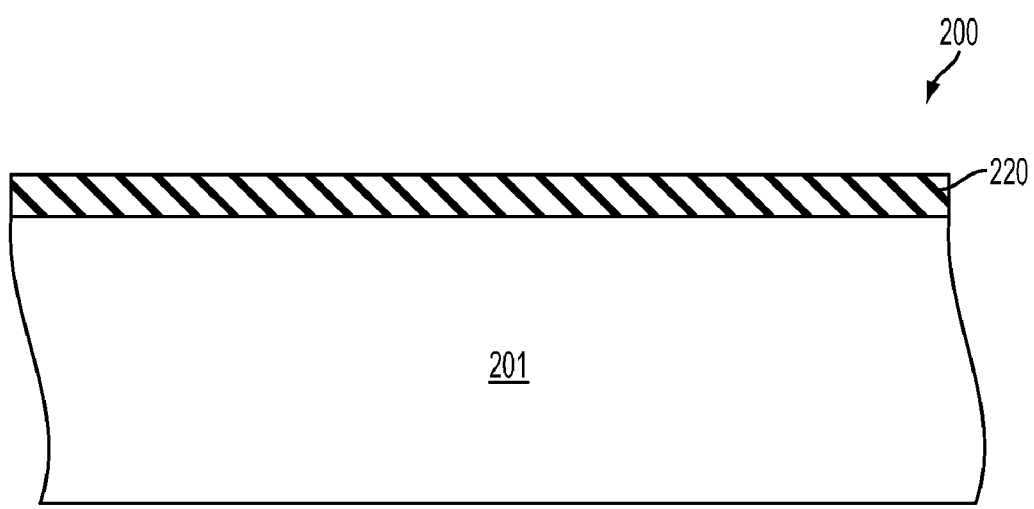

Referring to FIGS. 1 and 2C, the method 100 can include forming a device quality silicon oxide layer by causing the surface of the substrate to interact with an oxygen-containing gas (block 120). For example, the fluorine-passivated surface 201 can interact with an oxygen-containing gas to form a device quality silicon oxide layer 220 on the substrate 201. In some embodiments, the term "device quality silicon oxide layer" means that the layer substantially includes a $SiO_2$ structure substantially without a $SiO_x$ structure in which x is less than 2. The device quality silicon oxide layer is not a native silicon oxide. Nor is the device quality silicon oxide a chemical silicon oxide that is purely formed by chemical reactions.

In some embodiments, the device quality silicon oxide 220 can be formed by a furnace process and/or a rapid oxidation process using an oxygen-containing precursor, e.g., oxygen ($O_2$) and/or ozone ($O_3$). For example, the device quality silicon oxide layer 220 can be grown in an oxygen environment below about 1000 degrees Celsius, and in another example below about 850 degrees Celsius. In other embodiments, the device quality silicon oxide layer 220 can be formed by an atomic layer deposition (ALD) process. The device quality silicon oxide layer 220 can have a thickness less than about 1 nanometers (nm), and in one embodiment, may be in a range from approximately 0.3 nm to approximately 1 nm. In other embodiments, the device quality silicon oxide layer 220 can have a thickness more than about 1 nm.

In some embodiments, the method 100 can optionally include removing a portion of the device quality silicon oxide (block 150). For example, the target thickness of the device quality silicon oxide layer 220 is about 1 nm. The device quality silicon oxide layer 220 can first be grown to about 1.5 nm. The removing process can then remove a portion of the device quality silicon oxide layer 220 of about 0.5 nm, such that the remaining device quality silicon oxide layer 220 has a thickness of about 1 nm. In other embodiments, the removing process can remove a portion of the device quality silicon oxide layer 220, such that the remaining device quality silicon oxide layer 220 has a thickness less than 1 nm, e.g., 0.3 nm or 0.5 nm. By controlling the remaining thickness of the device quality silicon oxide layer 220, the equivalent oxide thickness (EOT) of the device can be modified.

In some embodiments, the removing process can use a vapor phase fluorine-containing chemical, e.g., hydrogen fluoride (HF), nitrogen trifluoride ($NF_3$), sulfur hexafluoride ($SF_6$), other fluorine-containing chemicals, or any combinations thereof. In other embodiments, the removing process can use a mixture including hydrogen fluoride (HF) and ammonia ($NH_3$). The hydrogen fluoride has a volume percentage ranging from about 10% to about 100%. In some embodiments, the removing process and the process of forming the device quality silicon oxide layer 220 can be performed in the same chamber.

It is noted that the process of forming the device quality silicon oxide layer 220 and/or the removing process are substantially water free. Chemical oxides and/or native oxides are substantially free from being formed between the substrate 201 and the device quality silicon oxide layer 220. Without chemical oxides and/or native oxides, device reliabilities and electron mobility can be desirably achieved.

Figure 2D:
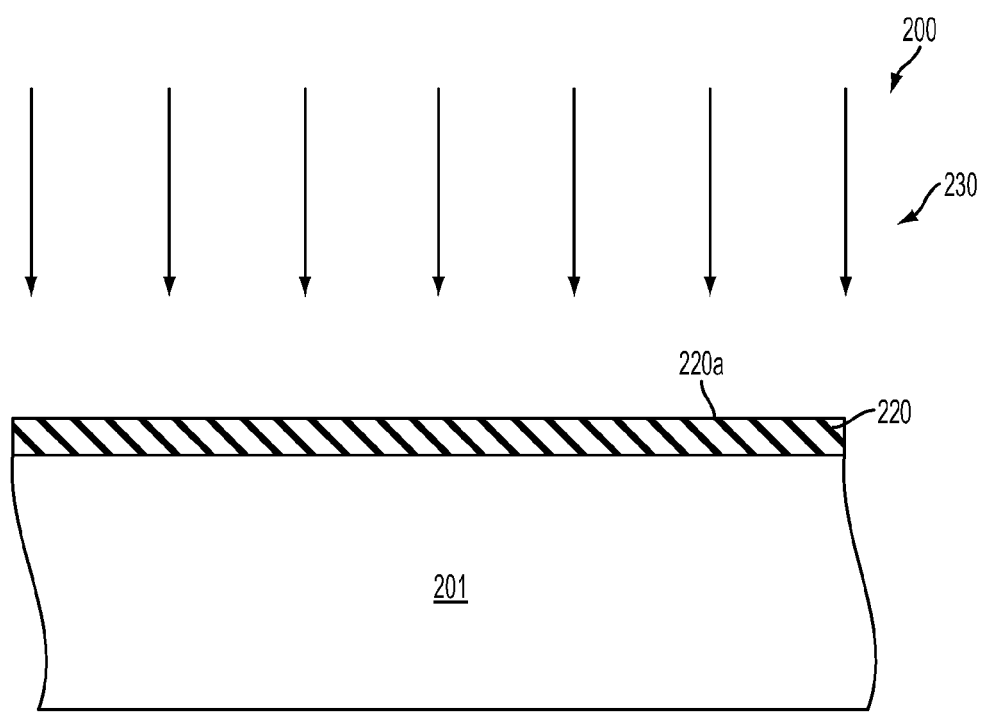

Referring to FIGS. 1 and 2D, the method 100 can include substantially forming hydroxyl groups on a surface of the device quality silicon oxide layer (block 130). For example, a process 230 can be performed for forming hydroxyl groups on the surface 220a of the device quality silicon oxide layer 220. In some embodiments, the process 230 can be a water soaking process, a water pulse process, any process that is suitable to form hydroxyl groups on the surface 220a, or any combinations thereof. In some embodiments, the process 230 can be an in-situ process that can be performed in the chamber in which the device quality silicon oxide layer 220 is formed. With the hydroxyl groups on the surface 220a, a high dielectric constant (high-k) gate dielectric layer (described below) can be inclined to form on the surface 220a. In some embodiments, the process 230 is substantially free from oxidizing the substrate 201.

Figure 2E:
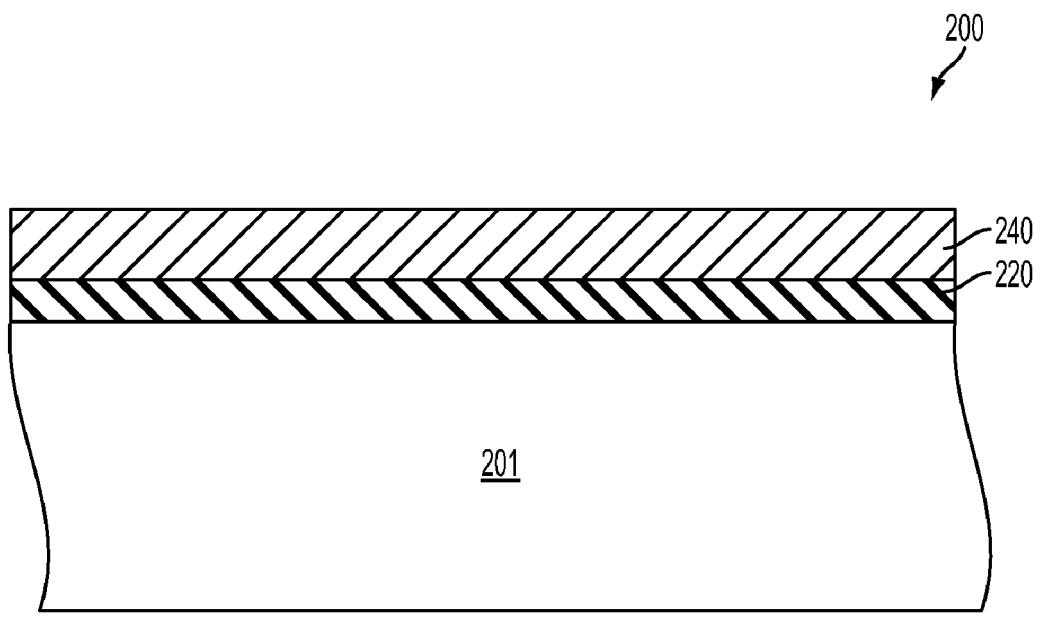

Referring to FIGS. 1 and 2E, the method 100 can include forming a high dielectric constant (high-k) gate dielectric layer on the surface of the device quality silicon oxide layer (block 140). As shown in FIG. 2E, a high dielectric constant (high-k) gate dielectric layer 240 can be formed on the device quality silicon oxide layer 220. As noted, the hydroxyl groups on the surface 220a can help the formation of the high-k gate dielectric layer 240. The quality of the high-k gate dielectric layer 240 can be desirably achieved.

In some embodiments, the high-k gate dielectric layer 240 can be formed by an ALD process and include a high-k dielectric material. A high-k dielectric material is a material having a dielectric constant that is greater than a dielectric constant of $SiO_2$, which is approximately 4. In other embodiments, the high-k gate dielectric layer 240 can include hafnium oxide ($HfO_2$), which has a dielectric constant that is in a range from approximately 18 to approximately 40. The high-k gate dielectric layer 240 can have a thickness that is greater than the device quality silicon oxide layer 220. In some embodiments, the high-k gate dielectric layer 240 can be in a range from about 1 nanometer to about 3 nanometers. In other embodiments, the high-k gate dielectric layer 240 may include at least one of $Al_2O_3$, HfO, ZrO, $ZrO_2$, ZrSiO, YO, $Y_2O_3$, LaO, $La_2O_5$, GdO, $Gd_2O_5$, TiO, $TiO_2$, TiSiO, TaO, $Ta_2O_5$, TaSiO, HfErO, HfLaO, HfYO, HfGdO, HfAlO, HfZrO, HfTiO, HfTaO, HfSiO, SrTiO, ZrSiON, HfZrTiO, HfZrSiON, HfZrLaO, HfZrAlO, or any combinations thereof.

Figure 2F:
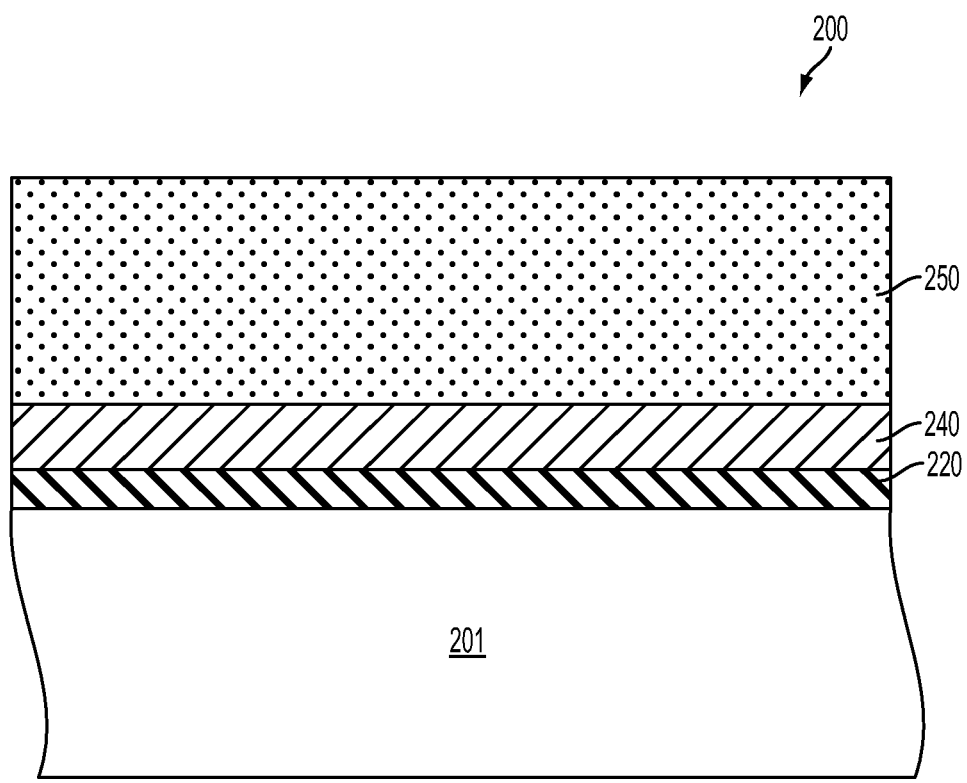

Referring now to FIG. 2F, a gate electrode layer 250 can be formed over the high-k gate dielectric layer 240. The gate electrode layer 250 may include a metallic material, such as TiN, TaN, TaC, TaSiN, WN, TiAl, W, Al, Cu, or any combinations thereof in the main body of the poly gate electrode. The metal gate electrode layer 250 may be formed by chemical vapor deposition (CVD), physical vapor deposition (PVD), or another suitable technique. The metal layer is a small portion of the gate electrode layer 250 in a gate-first process flow.

Figure 2G:
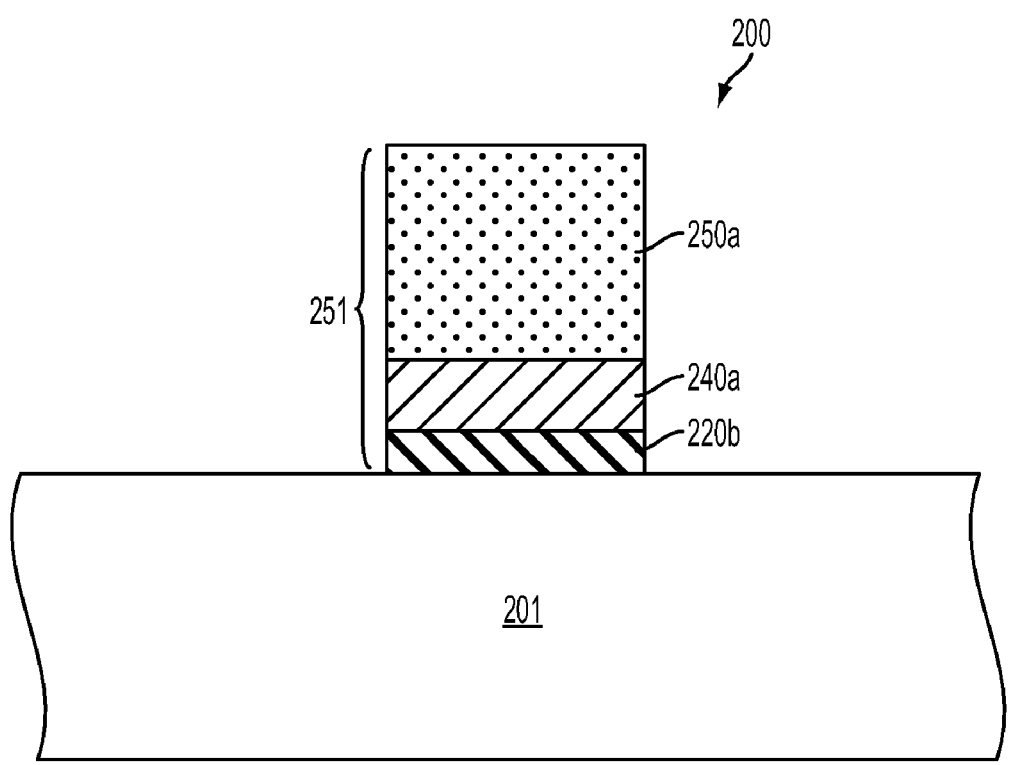

Referring to FIG. 2G, the device quality silicon oxide layer 220, the high-k gate dielectric layer 240, and the gate electrode layer 250 (shown in FIG. 2F) can be patterned using a photolithography process to form a gate stack structure 251 including a device quality silicon oxide layer 220b, a high-k gate dielectric layer 240a, and a gate electrode layer 250a. In some embodiments, the gate stack structure 251 can be formed in a gate-last process flow that can be referred to as a replacement gate process flow.

Figure 2H:
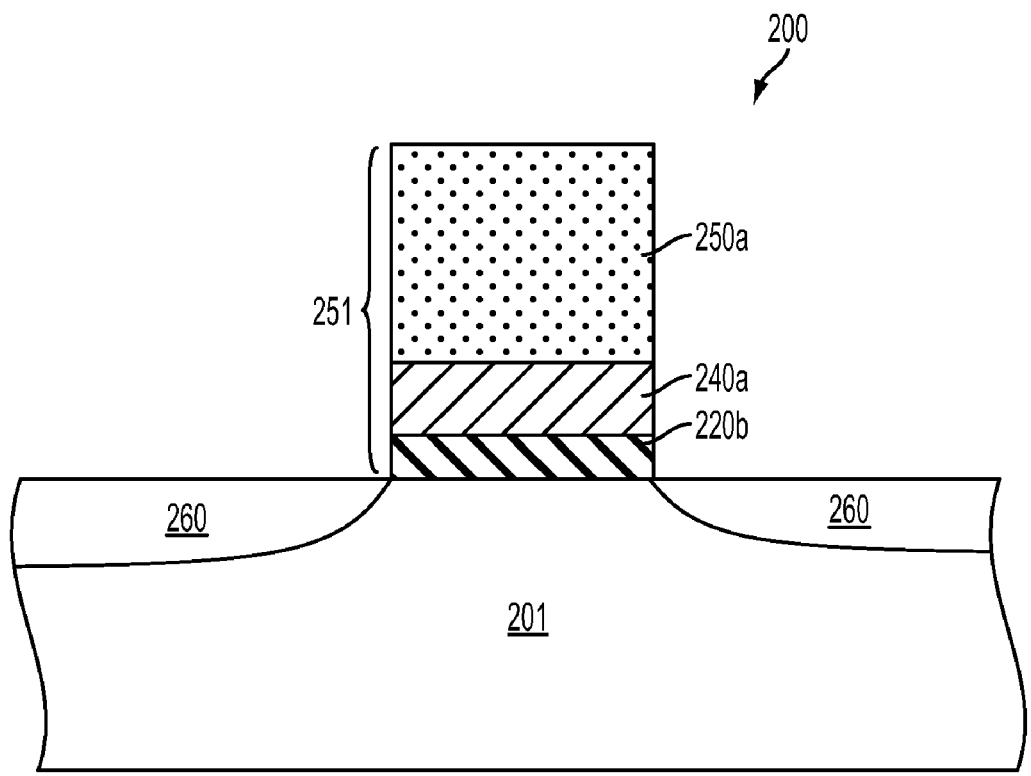

Referring to FIG. 2H, after the gate structure 251 is formed, lightly doped source/drain (also referred to as LDD) regions 260 may be formed in portions of the substrate 201 on each side of the gate structure 251. The LDD regions 260 may be formed by an ion implantation process and/or a diffusion process. N-type dopants, such as phosphorus or arsenic, may be used to form an NMOS device, and P-type dopants, such as boron, may be used to form a PMOS device.

Figure 2I:
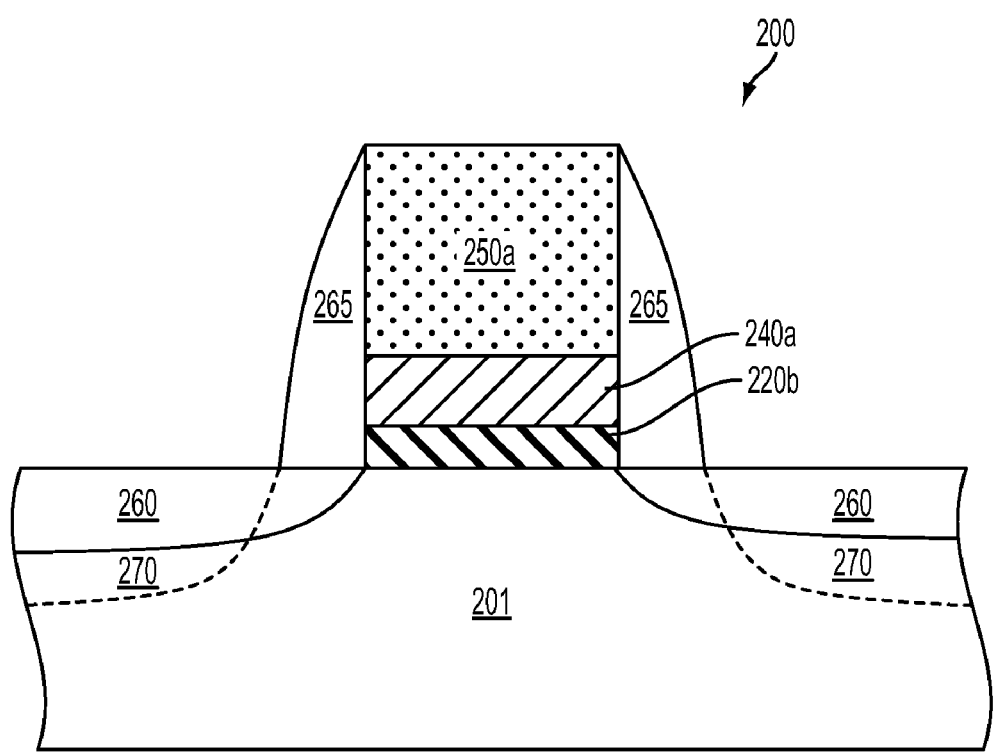

Referring to FIG. 2I, gate spacers 265 can then be formed over the substrate and on each side of the gate stack structure 251 using a deposition process and an etching process (for example, an anisotropic etching process). The gate spacers 265 can include a suitable dielectric material, such as silicon nitride, silicon oxide, silicon carbide, silicon oxy-nitride, or combinations thereof. Thereafter, heavily doped source/drain (S/D) regions 270 can be formed in portions of the substrate 201 on each side of the gate spacers 265. The S/D regions 270 can be formed by an ion implantation process and/or a diffusion process. N-type dopants, such as phosphorus or arsenic, can be used to form an NMOS device, and P-type dopants, such as boron, can be used to form a PMOS device. The S/D regions 270 can be aligned with the gate spacers 265.

After forming the S/D regions 270, an inter-layer (or inter-level) dielectric (ILD) layer (not shown) can be formed over the substrate 201 and the gate stack structure 251. The ILD layer can be formed by chemical vapor deposition (CVD), high density plasma CVD, spin-on, sputtering, or other suitable methods. In some embodiments, the ILD layer can include silicon oxide, e.g., undoped silicate glass (USG), boron-doped silicate glass (BSG), phosphor-doped silicate glass (PSG), boron-phosphor-doped silicate glass (BPSG), or the like, silicon oxynitride, silicon nitride, a low-k material, or any combinations thereof.

Although not illustrated, one or more annealing processes are performed on the semiconductor device to activate the S/D regions 270. These annealing processes can have relatively high temperatures (such as temperatures greater than approximately 700 degrees Celsius) and can be performed before or after a chemical-mechanical polish (CMP) process on the ILD layer.

Thus, FIGS. 2A-2I illustrate the various stages of a "gate first" process. Additional processes may be performed to complete the fabrication of the integrated circuit 200, such as the forming of an interconnect structure and other backend structures. For the sake of simplicity, these processes are not illustrated herein.

As described above, it is understood that the gate electrode layer 250a may either be used in a "gate first" process, or the gate electrode layer 250a can be used as a dummy gate electrode in a "gate last" process. For example, if gate electrode 250a shown in FIG. 2I is formed of a polysilicon material, a CMP process could be performed on the ILD layer (not shown) to expose a top surface of the gate stack structure 251. Following the CMP process, the top surface of the gate structure 251 is substantially co-planar with the top surface of the ILD layer on either side of the gate stack structure 251. Although not illustrated, one or more annealing processes are performed on the integrated circuit 200 to activate the S/D regions 270. These annealing processes may have relatively high temperatures (such as temperatures greater than approximately 700 degrees Celsius) and may be performed before or after the CMP process. As discussed above, the high-k gate dielectric layer 240a is capable of withstanding such high annealing temperatures without crystallizing, thus reducing potential gate leakage current. Afterwards, the gate electrode 250a can be removed, thereby forming a trench in place of the gate electrode 250a. The gate electrode 250a may be removed in a wet etching or a dry etching process, while the other layers of the integrated circuit 200 remain substantially un-etched. Since the polysilicon gate electrode 250a is removed in the gate last process, it is also referred to as a "dummy gate." Finally, a metallic structure can be formed within the trench and over the high-k gate dielectric layer 240a. The metallic structure can include at least one of a metal diffusion layer, a metallic work function layer, a metallic conductive layer, other suitable semiconductor layers, or any combinations thereof.

Figure 3:
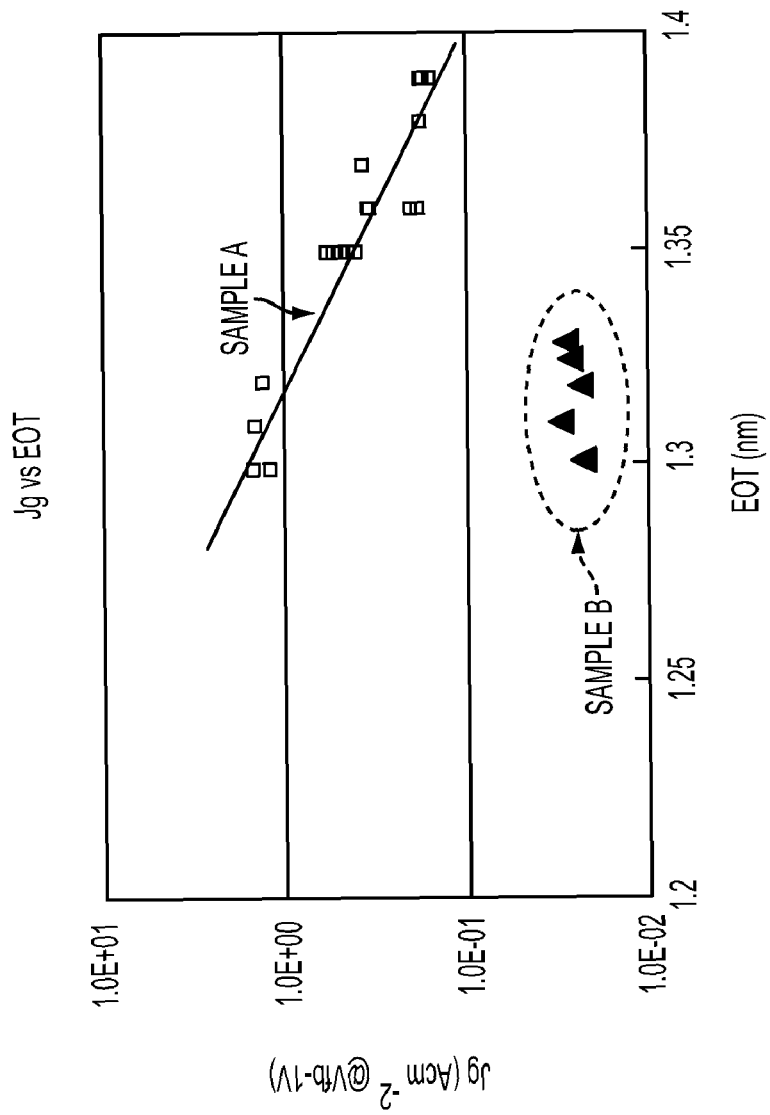
FIG. 3 is a schematic drawing illustrating a $J_g$-EOT (gate leakage current density-equivalent oxide thickness (EOT)) relation.

FIG. 3 is a schematic drawing illustrating a $J_g$-EOT (gate leakage current density-equivalent oxide thickness (EOT)) relation. In FIG. 3, sample A is prepared by an SC1 process and then a silicon oxide interfacial layer immediately follows the SC1 process. As noted, a chemical oxide layer is formed between the substrate and the interfacial layer. Sample B is prepared by the method 100 described above in conjunction with FIG. 1. It is found that the gate leakage current of the sample B is substantially and unexpectedly lower than that of the sample A as shown in FIG. 3.

It is understood that additional processes may be performed to complete the fabrication of the integrated circuit 200. For example, these additional processes may include deposition of passivation layers, formation of contacts, and formation of interconnect structures (e.g., lines and vias, metal layers, and interlayer dielectric that provide electrical interconnection to the device including the formed metal gate). For the sake of simplicity, these additional processes are not described herein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated circuit, the method comprising:
    forming a fluorine-passivated surface of a substrate;
    forming a device quality silicon oxide layer by causing the fluorine-passivated surface to interact with an oxygen-containing gas;
    substantially forming hydroxyl groups on a surface of the device quality silicon oxide layer; and
    forming a high dielectric constant (high-k) gate dielectric layer on the surface of the device quality silicon oxide layer.

2. The method of claim 1, further comprising:
    after forming the device quality silicon oxide layer and before substantially forming the hydroxyl groups, removing a portion of the device quality silicon oxide layer.

3. The method of claim 2, wherein removing the portion of the device quality silicon oxide layer comprises using a vapor phase fluorine-containing chemical.

4. The method of claim 2, wherein removing the portion of the device quality silicon oxide layer comprises using a mixture including ammonia ($NH_3$) and hydrogen fluoride (HF).

5. The method of claim 4, wherein the hydrogen fluoride has a volume percentage ranging from about 10% to about 100%.

6. The method of claim 2, wherein removing the portion of the device quality silicon oxide layer and substantially forming the hydroxyl groups are performed in the same chamber.

7. The method of claim 1, wherein substantially forming the hydroxyl groups comprises subjecting the surface of the device quality silicon oxide layer to at least one process including a water-soaking process and a water-pulse process.

8. The method of claim 1, wherein the fluorine-passivated surface has substantial silicon-hydrogen bonds and silicon-fluorine bonds and forming the fluorine-passivated surface comprises using a vapor phase fluorine-containing chemical.

9. A method of forming an integrated circuit, the method comprising:
    substantially forming silicon-hydrogen bonds and silicon-fluorine bonds on a surface of a substrate using a vapor phase fluorine-containing chemical;
    forming a device quality silicon oxide layer by causing the surface of the substrate to interact with an oxygen-containing gas;
    substantially forming hydroxyl groups on a surface of the device quality silicon oxide layer; and
    forming a high dielectric constant (high-k) gate dielectric layer on the surface of the device quality silicon oxide layer.

10. The method of claim 9, further comprising:
    after forming the device quality silicon oxide layer and before substantially forming the hydroxyl groups, removing a portion of the device quality silicon oxide layer.

11. The method of claim 10, wherein removing the portion of the device quality silicon oxide layer comprises using a vapor phase fluorine-containing chemical.

12. The method of claim 10, wherein removing the portion of the device quality silicon oxide layer comprises using a mixture including ammonia ($NH_3$) and hydrogen fluoride (HF).

13. The method of claim 12, wherein the hydrogen fluoride has a volume percentage ranging from about 10% to about 100%.

14. The method of claim 10, wherein removing the portion of the device quality silicon oxide layer and substantially forming the hydroxyl groups are performed in the same chamber.

15. The method of claim 9, wherein substantially forming the hydroxyl groups comprises subjecting the surface of the device quality silicon oxide layer to at least one process including a water-soaking process and a water-pulse process.

16. A method of forming an integrated circuit, the method comprising:
    forming a fluorine-passivated surface of a substrate using a vapor phase fluorine-containing chemical;
    forming a device quality silicon oxide layer by causing the fluorine-passivated surface to interact with an oxygen-containing gas;
    removing a portion of the device quality silicon oxide layer using a vapor phase fluorine-containing chemical;
    substantially forming hydroxyl groups on a surface of the remaining device quality silicon oxide layer; and
    forming a high dielectric constant (high-k) gate dielectric layer on the surface of the device quality silicon oxide layer.

17. The method of claim 16, wherein removing the portion of the device quality silicon oxide layer comprises using a mixture including ammonia ($NH_3$) and hydrogen fluoride (HF).

18. The method of claim 16, wherein the hydrogen fluoride has a volume percentage ranging from about 10% to about 100%.

19. The method of claim 16, wherein removing the portion of the device quality silicon oxide layer and substantially forming the hydroxyl groups are performed in the same chamber.

20. The method of claim 19, where substantially forming the hydroxyl groups comprises subjecting the surface of the device quality silicon oxide layer to at least one process including a water-soaking process and a water-pulse process.

* * * * *